United States Patent [19]
Satoh et al.

[11] Patent Number: 5,774,962
[45] Date of Patent: Jul. 7, 1998

[54] PROCESS FOR PRODUCING A SURFACE ACOUSTIC WAVE DEVICE

[75] Inventors: Yoshio Satoh; Osamu Ikata; Hidema Uchishiba; Takashi Matsuda; Tokihiro Nishihara; Mitsuo Takanatsu; Hajime Taniguchi, all of Kawasaki, Japan

[73] Assignee: Fujitsu Limited, Kawasaki, Japan

[21] Appl. No.: 676,504

[22] Filed: Jul. 8, 1996

Related U.S. Application Data

[62] Division of Ser. No. 297,914, Aug. 31, 1994.

[30] Foreign Application Priority Data

Oct. 27, 1993 [JP] Japan ................................ 5-268542

[51] Int. Cl.$^6$ ........................................ H04R 17/00
[52] U.S. Cl. ........................................ 29/25.35
[58] Field of Search .................... 29/25.35; 310/364, 310/313 A, 313 B, 313 C, 313 D

[56] References Cited

U.S. PATENT DOCUMENTS

| | | | |
|---|---|---|---|
| 4,017,890 | 4/1977 | Howard et al. | 357/67 |
| 4,445,066 | 4/1984 | Nishiyama et al. | 310/364 |
| 5,071,714 | 12/1991 | Rodbell et al. | |
| 5,144,185 | 9/1992 | Yuhara et al. | 310/313 |
| 5,171,642 | 12/1992 | DeHaven et al. | |

FOREIGN PATENT DOCUMENTS

| | | |
|---|---|---|
| 0 246 626 | 11/1987 | European Pat. Off. |
| 63-4648 | 1/1988 | Japan |
| 63-9971 | 1/1988 | Japan |
| 63-278343 | 11/1988 | Japan |
| 2-84719 | 3/1990 | Japan |
| 2-296334 | 12/1990 | Japan |
| 3-152935 | 6/1991 | Japan |

Primary Examiner—Carl E. Hall
Assistant Examiner—Christopher Goins
Attorney, Agent, or Firm—Staas & Halsey

[57] ABSTRACT

This invention relates to a surface acoustic wave device and a production process thereof. An electrode is formed by alternately laminating a film of an aluminum alloy containing at least copper added thereto and a copper film on a piezoelectric substrate. While the particle size of the multi-layered electrode materials is kept small, the occurrence of voids in the film is prevented and life time of the surface acoustic wave device is elongated.

6 Claims, 10 Drawing Sheets

⊘ Cu
⊙ Aℓ

PROCESS FOR PRODUCING A SURFACE ACOUSTIC WAVE DEVICE

This application is a division of application Ser. No. 08/297,914, filed Aug. 31, 1994, now pending.

BACKGROUND OF THE INVENTION

1. Field of the Invention

This invention relates to a surface acoustic wave device and a production process thereof.

Generally, a surface acoustic wave (SAW) device comprises a piezoelectric substrate and a comb-shaped interdigital electrode disposed on the substrate, for converting a voltage to a surface acoustic wave or vice versa. The function of the surface acoustic wave device is to convert a radio frequency voltage to a surface acoustic wave having a wavelength of about $10_{-5}$ times by using a comb-shaped interdigital electrode, which causes this wave to propagate on the surface of the piezoelectric substrate and converts again the wave to the voltage by the comb-shaped interdigital electrode.

Frequency selectivity can be provided in accordance with the shape of the interdigital electrode during the two conversion operations between the surface acoustic wave and the voltage, and a filter or a resonator can be constituted by utilizing this characteristic property. Because the propagation speed can be retarded to about $10_{-5}$ times that of an electromagnetic wave, the surface acoustic wave device can be used as a delay device.

The application of the surface acoustic wave device to small, economical filters, resonators, delay lines, etc., has already been done by utilizing the functions described above. In other words, the surface acoustic wave device has been applied to IF filters of television sets, resonators of VTR (vide tape recorder) oscillators, VCOs of cordless telephones, and recently, the application has been expanded to RF filters and IF filters of automobile telephones, mobile telephones, and so forth.

To further expand the utilization in this field, it is important to improve a pass band and power characteristics of the surface acoustic wave device. Particularly in the case of the automobile telephones and the mobile telephones, transmission power is relatively great, that is, 0.6 to 3W, and a large RF power is applied to a filter of a front-end portion inside the apparatus, particularly, to an antenna duplexer.

The maximum input power of the surface acoustic wave filter has been about 0.2W up to the present, and the filter lacks sufficient power characteristics. For this reason, a dielectric filter having high power resistance has been used for the antenna duplexer. However, because the dielectric filter is large in scale, it causes a problem when the size of the apparatus is reduced as a whole.

Accordingly, if the power characteristics of the surface acoustic wave device can be improved and the antenna duplexer can be realized by utilizing the surface acoustic wave device, the mobile telephones can be made even smaller, and the effect of utilization in industry becomes greater.

2. Description of the Related Art

The interdigital electrode is used in the surface acoustic wave device as described above, and aluminum (Al) or an aluminum alloy containing a small amount of a different kind of metal (not always a solid solution body in many cases) is generally used because the mass is small and its electrical resistance value is low.

Several proposals have been made for the structure of the antenna duplexer using the surface acoustic wave device. Typical examples are described in Japanese Unexamined Patent Publication (Kokai) Nos. 5-167388 and 5-167389. In order to simplify the filter structure in the duplexer and to secure desired characteristics, Japanese Unexamined Patent Publication (Kokai) No. 5-167388 proposes to constitute a duplexer by using a plurality of band-pass filters each formed by using the surface acoustic wave device. Japanese Unexamined Patent Publication (Kokai) No. 5-167389 proposes to integrate a plurality of surface acoustic wave band-pass filter chips having mutually different center frequency bands and having signal input/output terminals and ground terminals, by storing them in one package so as to minimize the duplexer while keeping excellent isolation.

However, the conventional antenna duplexer does not have characteristics such that the filer can sufficiently withstand the increase of RF power. To evaluate the power resistance or characteristics, the life time at the maximum input power at which the apparatus can be used is generally used as a guideline. The conventional antenna duplexer has a life time of only about 1,600 hours at the 1W input at an environmental temperature of 85° C. (chip temperature of 120° C.) in an accelerated deterioration test stipulated for the mobile telephones of the NTT specification in Japan, for example. These values are not considered sufficient for the life of mobile telephones, and the values of at least twice are believed necessary.

The main factor that determines the useful life of the surface acoustic wave device is power characteristics of electrode fingers of the filter (interdigital electrode fingers IDT), and an aluminum system alloy film containing a trace amount of copper and formed by sputtering, which is well known as being resistant to migration in the field of semiconductor devices, has been used. However, this alloy is not yet sufficient as the electrode material of the surface acoustic wave device used as the antenna duplexer to which a high power load is applied.

Besides the patent references described above, the following reports have been made regarding the methods of improving electric power of the electrode of the surface acoustic wave device.

1. Change of addition metal in aluminum (Al) system alloy:

The use of an aluminum-titanium alloy (AlTi), etc., for example, is described in detail in "Examination of Al System Thin Film Material for SAW Power-Resistant Electrode and Production Method Thereof" (by Yuhara et al.), No. 17th EM Symposium Presume, pp. 7–12. According to this report, the useful life of the surface acoustic wave device can be improved by about 10 times the life of an aluminum-copper (Al-Cu) alloy film by changing the electrode material to an aluminum-titanium (Al-Ti) alloy.

2. Use of aluminum (Al) epitaxial single crystal film:

This method is based on the fact that grain boundary diffusion in stress migration of aluminum (Al) can be restricted by converting the structure to a single crystal, and is reported in papers of the Electronic Data Communication Society, A, Vol. J76-A, No. 2, pp. 145–152 (1993) (by Ieki et al.). According to this report, life time can be improved to 2,000 times that of an aluminum-copper alloy (Al-Cu) film by vacuum evaporation.

In comparison with films formed by sputtering, the useful life of an aluminum-copper alloy (Al-Cu) film formed by vacuum evaporation is much shorter from the beginning (refer to Yuhara et al., and other references), and the improvement in life time is believed to be substantially 20 to 200 times. At present, however, it has been confirmed only that this method can cause epitaxial growth only when the substrate material as the base is quartz, and cannot realize the film when LiTaO₃ or LiNbO₃, which have been widely used as a substrate material for filters for mobile communication, is employed.

As described above, stress migration in the surface acoustic wave device is analogous to electromigration and stress migration in wiring technology of semiconductor devices, and migration-resistant technology in the semiconductor devices will be useful for the migration-resistant technology in the surface acoustic wave devices. Among them, the following technology has drawn increasing attention.

Namely, it is the method which forms in a laminar form a film of an intermetallic compound of aluminum (Al) and a transition metal between the aluminum (Al) films so as to block electromigration of the aluminum (Al) atoms by the intermetallic compound. This method is reported in U.S. Pat. No. 4,017,890 (J. K. Howard, IBM, Apr. 1977) and in connection with this patent, a report is made by J. K. Howard, J. F. White and P. S. Ho in "J. Appl. Phys., Vol. 49, p. 4083 (1978).

According to these reports, life time becomes maximal when chromium (Cr) is used as the transition metal, and is about 10 times that of the aluminum-copper alloy (Al-Cu). However, when the inventors of the present invention applied this method to the electrode of the surface acoustic wave device, a sufficient effect could not be obtained.

As described above, several methods have been proposed as the prior art technologies for improving the electrode materials, but none of them have provided sufficient power characteristics. Accordingly, development of an electrode material having higher performance has been necessary. As a matter of fact, when the method of improving the power characteristics by the multi-layered structure of the aluminum films (Al) and the intermetallic compound of the aluminum (Al) and the transition metal is applied to the surface acoustic wave device, no effect can be observed but performance actually deteriorates.

FIG. 1 is an explanatory structural view of a surface acoustic wave filer having the conventional three-layered structure. In the drawing, reference numeral 11 denotes a LiTaO₃ piezoelectric substrate, 12 is an Al-1%Cu alloy film, 13 is a Ta film, 14 is an Al-1%Cu film, and 15 and 16 are Al-Ta alloy films.

In the surface acoustic wave filter using this conventional three-layered electrode structure, an 1,000Å-thick Al-1%Cu alloy film 12 is formed on the LiTaO₃ piezoelectric substrate 11, a 500Å-thick Ta film 13 is formed on the former, and a 1,000Å-thick Al-1%Cu film 14 is further formed on the Ta film 13. Next, heat-treatment is carried out at 400° C. in vacuum so as to form sufficient Ta-Al (TaAl₃) 15 and 16 on the interface between the Al-1%Cu films 12, 14 and the Ta film 13 and in the grain boundaries of the Al-1%Cu alloy films 12, 14. The electrode structure is then patterned into an interdigital shape to form the electrode. When the useful life of this surface acoustic wave filter is measured by conducting an accelerated deterioration test at a chip temperature of 120° C. and radio frequency power of 1W, the life expectancy is found to be 100 hours, and drops to ¹⁄₁₆ of the life time of a 3,200Å.-thick Al-1%Cu single layered film, that is, 1,600 hours.

FIG. 2 is a graph useful for explaining power characteristics of a surface acoustic wave filter having the conventional three-Alayered structure.

In the graph, the abscissa represents input power (W) and the ordinate represents life time (mean time to failure; MTTF, hours). Curve a represents an Al-1%Cu single layer film which is not heat-treated, curve b represents an Al-1%Cu/Ta/Al-1%Cu film which is not heat-treated, and curve c represents an Al-1%Cu/Ta/Al-1%Cu film which is heat-treated at 400° C. The substrate (chip) temperature when forming each film is 120° C., and each film has a thickness of 3,200Å.

According to the J. K. Howard et al. reference described above, the surface acoustic wave filter having the three-Alayered structure electrode described above should provide longer life at least 20 times that of the Al-1%Cu film. According to experiments, however, the actual life of the Al-1%Cu/Ta/Al-1%Cu film (see curve c) which is formed under the ordinary heat-treatment conditions at 400° C. is much shorter than the life of the Al-1%Cu single layer film (see curve a) which is not heat-treated. This difference results from some differences of a life deterioration mechanism of wirings of semiconductor devices from a life deterioration mechanism of IDT (Interdigital Transducer) of the surface acoustic wave filter.

In short, both electromigration of the Al atoms and static stress migration are involved in the life deterioration of the wirings of the semiconductor devices, whereas the life deterioration of IDT of the surface acoustic wave device mainly results from the dynamic stress migration. Here, the static stress migration means the Al migration driven by the static internal stress of Al films. The dynamic stress migration means the Al migration driven by the dynamic migration of the internal stress caused by the acoustic surface wave propagation. Depending on parameters associated with the life deterioration, exactly opposite actions result in some cases due to the difference of electromigration from the dynamic stress migration. A typical example is the grain size of Al. According to J. B. Ghate, "Electro-migration-Induced Failure VLSI Interconnectors", Solid State Technology, pp. 113–120, 1983, the greater the grain size, the greater the effect of suppressing electromigration and the longer life becomes, in the case of the wirings of the semiconductor devices. On the other hand, according to the aforementioned Yuhara et al. reference, the greater the grain size, the shorter life becomes, in the case of the surface acoustic wave device.

FIG. 3 is a graph useful for schematically explaining the relation between the grain size of the electrode material and life time. The abscissa in the graph represents the grain size, and the ordinate represents life time. As shown in the graph, since electromigration is predominant in the case of the wirings of the semiconductor device, life time becomes longer with the increase of the grain size (see curve b). In the case of the surface acoustic wave (SAW) device electrode, on the other hand, since stress migration is predominant, life time becomes shorter with the increase of the grain size of the electrode material (see curve a). The grain size of the electrode material can be increased by applying heat-treatment.

It can be interpreted from the sequence described above that the cause of deterioration of the Al-1%Cu/Ta/Al-1%Cu film formed conventionally by applying heat-treatment at 400° C. and represented by the curve c in FIG. 2 is this heat-treatment at 400° C., since the grain size becomes greater and stress migration becomes more likely to occur due to this heat-treatment, so life time is reduced. To further support this fact, a three-layered film having the same structure is formed without carrying out the heat-treatment and moreover, in such a manner that the temperature never exceeds 200° C. throughout the full process, so as to constitute the surface acoustic wave filter. When life of this filter is evaluated, the curve b in FIG. 2 can be obtained, and life time is substantially equal to that of the Al-1%Cu single layered film (see curve a).

It can be understood that when the heat-treatment is not carried out at a high temperature of about 400° C., life time can be drastically improved. This is because the grain size can be kept small. In this case, although the grain size remains small and life time is relatively long, the alloy between Al and the transition metal is not formed between the layers because heat-treatment is not effected, and because the function of a stopper for inhibiting cracks occurring in the film, that is, the growth of voids, does not exist, so life time is not improved in comparison with the Al-1%Cu single layered film which is not heat-treated (see curve a).

SUMMARY OF THE INVENTION

It is an object of the present invention to provide a surface acoustic wave device which can prevent the occurrence of voids in a film while keeping a grain size of an Al-Cu multi-layered film small, and which has a long life time.

It is another object of the present invention to provide a process for producing such a surface acoustic wave device.

These and other objects of the present invention will become more apparent from the following detailed description of preferred embodiments thereof.

According to the present invention, there is provided a surface acoustic wave device which comprises a piezoelectric substrate and an electrode formed on the substrate by alternately laminating a film of aluminum containing at least copper added thereto or an alloy of such aluminum and a copper film. In this case, the electrode is a transducer for converting an electrical signal to a surface acoustic wave.

In the surface acoustic wave device according to the present invention, directions of internal stresses of the film of aluminum containing at least copper or the alloy of such aluminum and the copper film preferably have opposite directions, and moreover, the sum of these internal stresses are zero (0) or compressive (stress on the negative side). When the internal stresses are regulated in this way, stress migration of aluminum can be reduced.

A laminate structure of the aluminum or aluminum alloy film/copper film constituting the electrode can be constituted arbitrarily into a two- or more multi-layered structure, and is preferably a two- or three-layered laminate structure. In such a multi-layered structure, the thickness of each film can be broadly changed in accordance with frequency and other various factors, but is generally and preferably within the range of from about 300Å to about 10,000Å.

In a preferred embodiment of the present invention, the electrode can be a two-layered laminate structure of the aluminum-copper alloy film and the copper film. Here, the thickness of the Al-Cu film for 800 to 1,000 MHz filters is preferably from about 1,000Å to about 5,000Å, and the thickness of the Cu film is preferably from about 300 to about 1,000Å.

In another preferred embodiment of the present invention, the electrode can be a three-layered laminate structure comprising two aluminum-copper alloy films and the copper film sandwiched between the aluminum-copper alloy films. The thickness of each of the Al-Cu films for 800 to 1,000 MHz filters is preferably from about 500Å to about 1,500Å, and the thickness of the Cu film is preferably from about 300Å to about 1,000Å.

In the surface acoustic wave device according to the present invention, it is essentially necessary to add copper to the aluminum or aluminum alloy film constituting the electrode. The amount of addition of copper is preferably from 0.4 to 4 wt% and further preferably, from 0.5 to 1.5 wt% on the basis of the weight of the film. If the amount of addition of copper is below 0.4 wt%, problems such as stress migrations appear, and if it exceeds 4 wt%, on the other hand, fine patterns of IDT can not be delineated by RIE (reactive ion etching) because of copper-based residue.

In the embodiments of the present invention, copper is most preferably added to the aluminum or aluminum alloy film.

The piezoelectric substrate used as the substrate can be those piezoelectric crystal substrates which are ordinarily used in surface acoustic wave devices, such as $LiNbO_3$, $LiTaO_3$, quartz, ZnO/glass, PZT type ceramics, and so forth. Preferably, $LiTaO_3$, such as $(36°Y-X)LiTaO_3$ and $LiNbO_3$ such as $(64°Y-X)LiNbO_3$, can be used effectively as the piezoelectric substrate.

When a surface acoustic wave device having a piezoelectric substrate and an electrode formed on the substrate is produced, the present invention provides a process for producing a surface acoustic wave device which comprises alternately laminating a film of aluminum containing at least copper added thereto and a copper film on the piezoelectric substrate at a temperature not higher than 200° C.; patterning the resulting laminate structure to form an electrode; and carrying out subsequent processings while maintaining the temperature of not higher than 200° C.

The piezoelectric substrate and the electrode formed on the substrate have already been described above. The electrode can be formed by laminating the respective films into a predetermined film thickness by ordinary film formation technology such as sputtering, CVD (Chemical Vapor Deposition), electron beam deposition, etc., and subsequently patterning the resulting laminate structure into a desired electrode shape.

The method of the present invention can restrict the growth of the grain boundary of the electrode materials by employing the process steps described above.

DESCRIPTION OF THE PREFERRED EMBODIMENTS

First, an electrode structure which can be advantageously utilized in a surface acoustic wave device according to the present invention, and the function and effect of such an electrode, will be explained.

Generally, it is believed that a film obtained by adding a small amount (about 3 to 4 wt%) of a different kind of metal to Al has a structure in which an alloy between Al and the different kind of metal exists at a grain boundary of Al.

Figure 10:
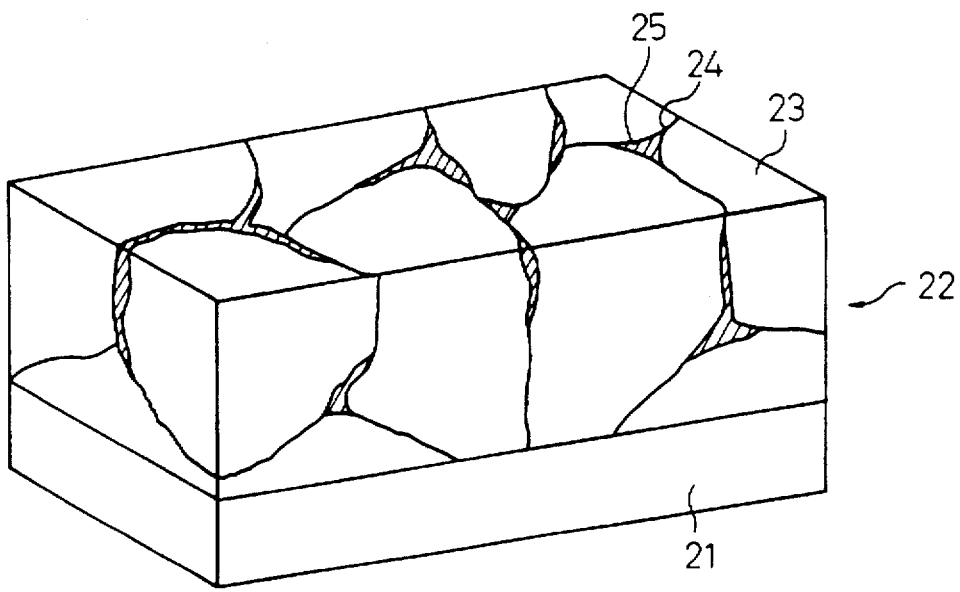
FIG. 10 is an explanatory view of an Al-Cu film electrode structure.

FIG. 10 is an explanatory view of an Al-Cu film electrode structure. In this drawing, reference numeral 21 denotes an $LiTaO_3$ substrate, 22 is an Al-Cu film, 23 is Al crystal grains, 24 is a grain boundary, and 25 is $CuAl_2$. This drawing illustrates an example where the Al-Cu film 22 is deposited on the $LiTaO_3$ substrate 21 by sputtering or electron beam deposition and is patterned. Basically, it is a polycrystalline structure of Al, wherein a large number of Al crystal grains 23 exist, and $CuAl_2$ 25 segregates at the grain boundary 24. It is believed that the reason why the Al-Cu film has higher resistance to migration than the Al film is because Cul2 25 inhibits fluidization of the Al atoms.

A similar effect can be obtained when Ti, Si, etc., is used as the metal to be added to Al, in place of Cu described above.

Figure 11:
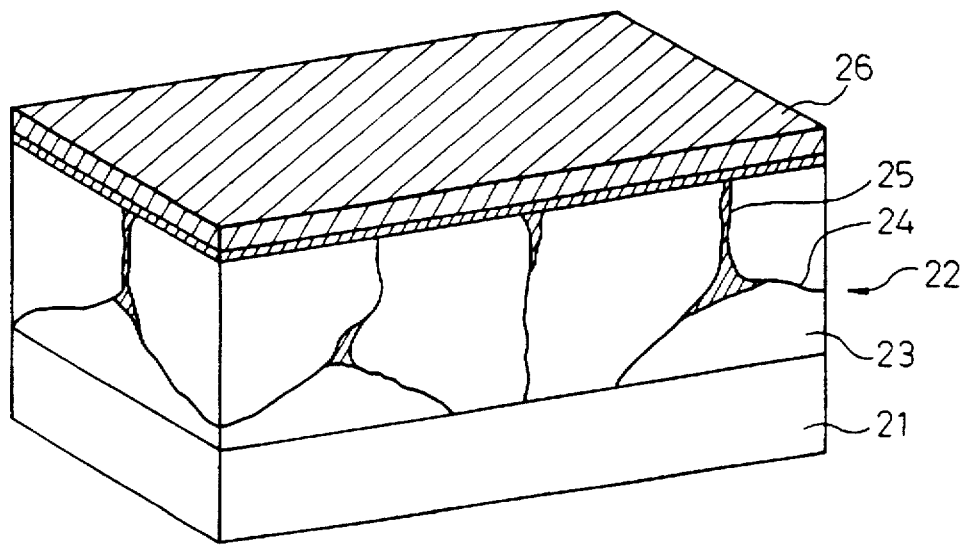
FIG. 11 is a perspective view useful for explaining an Al-Cu/Cu film electrode structure.

Next, we consider the case where a Cu film is formed on the upper surface of the Al film having this structure, with reference to FIG. 11.

FIG. 11 is an explanatory view of an Al-Cu/Cu film electrode structure. In the drawing, reference numeral 21 denotes a $LiTaO_3$ substrate, 22 is an Al-Cu film, 23 is Al crystal grains, 24 is a grain boundary, 25 is $CuAl_2$ and 26 is a Cu film. The drawing illustrates an example where the Al-Cu alloy film 22 is formed on the $LiTaO_3$ substrate 21 by sputtering or electron beam deposition, the Cu film 26 is formed on the former and the Cu film 26 is then patterned. This is basically a polycrystalline structure of Al. A large number of Al crystal grains 23 exist, and $CuAl_2$ 25 segregates between the grain boundary 24, the Al-Cu film 22 and the Cu film 26.

Even when the temperature is as low as below 200° C. when forming the Cu film 26 on the Al-Cu film 22, a small amount of $CuAl_2$ 25 is formed on the interface between the grain boundary, the Al-Cu film 22 and the Cu film 26. The reason for this is believed to be as follows. Cu to be sputtered has large kinetic energy and impinges against Al, and the film is formed while Cu imparts kinetic energy to the Al atoms. Therefore, an effect similar to the effect of local heat-treatment occurs, and $CuAl_2$ is formed on the interface between the Al-Cu alloy film 22 and the Cu film 26. The thickness of $Cu-Al_2$ on the interface is some dozens of angstroms (Å).

Now, let's consider the case where the Al-Cu alloy film is further formed on the film having the structure shown in FIG. 11.

Figure 12:
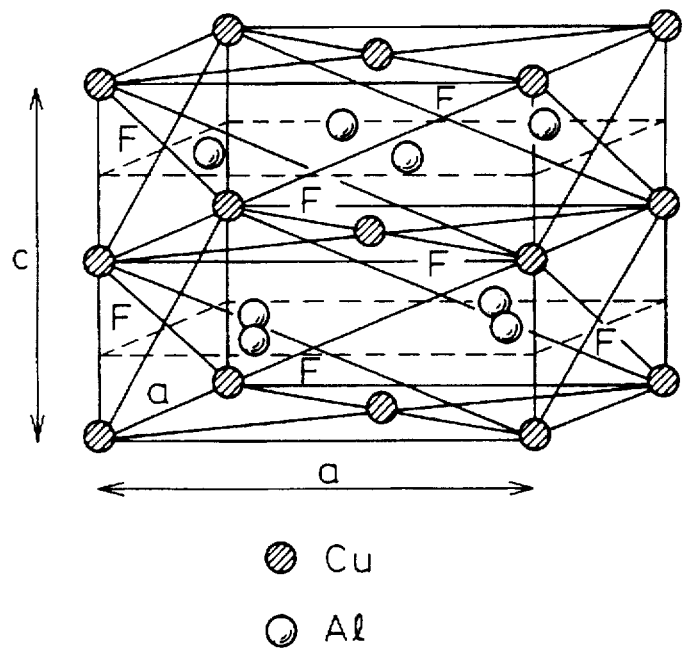
FIG. 12 is a schematic view useful for explaining a $CuAl_2$ crystal structure.

FIG. 12 is an explanatory view of the $CuAl_2$ crystal structure. As shown in the drawing, the $CuAl_2$ crystal has the structure wherein the Cu layers and the Al layers are alternately laminated. Therefore, matching with the Cu film is extremely excellent, and firm bonding can be expected. Because $CuAl_2$ 25 existing in the Al grain boundary 24 of the Al-Cu film 22 shown in FIG. 11 and $CuAl_2$ 25 existing on the interface between the Al-Cu film 22 and the Cu film 26 are the same crystal, mutual bonding strength becomes high.

Figure 13:
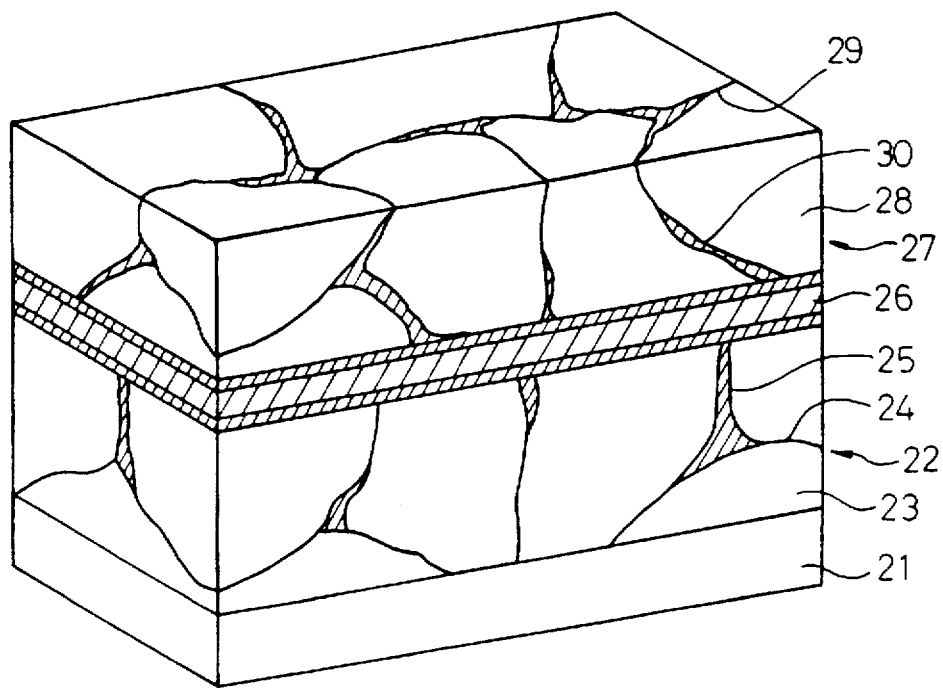
FIG. 13 is a perspective view useful for explaining an Al-Cu/Cu/Al-Cu film electrode structure.

FIG. 13 is an explanatory view of an Al-Cu/Cu/Al-Cu film electrode structure. In this drawing, reference numeral 21 denotes a $LiTaO_3$ substrate, 22 is an Al-Cu film, 23 is an Al crystal grain, 24 is a grain boundary, 25 is $CuAl_2$, 26 is a Cu film, 27 is an Al-Cu film, 28 is an Al crystal grain, 29 is a grain boundary, and 30 is $CUl_2$. The drawing illustrates an example where the Al-Cu film 22 is formed on the $LiTaO_3$ substrate 21 by sputtering or electron beam deposition, the Cu film 26 is formed on the former, and the Al-CU film 27 is further formed on the Cu film 26 and is patterned. $CuAl_2$ 25 is formed in the grain boundary 24 of the Al crystal grains 23 of the Al-Cu film 22. $CuAl_2$ 30 is formed in the grain boundary 29 of the Al crystal grains 28 of the Al-Cu film 27, and $CuAl_2$ is further formed between the Cu film 26 and the upper and lower Al-Cu films 22, 27.

Under such a condition, $CuAl_2$ 25, 30 existing in the grain boundaries 24, 29 in the upper and lower Al-Cu films 22, 27 and $CuAl_2$ existing on the interface between the Al-Cu films 22, 27 and the Cu film 26 are strongly bonded to one another, and the Cu film at the center of the film as a whole functions as the framework, while $CuAl_2$ existing in the grain boundaries of the upper and lower Al-Cu film has a small bone network structure. Accordingly, a film having high resistance to stress migration can be realized at a low temperature of below 200° C. When heat-treatment is applied to the film, $CuAl_2$ on the interface becomes thick, but because the Al crystal grains grow to a large grain size as described already, the resistance to stress migration drops. Accordingly, heat-treatment at a high temperature above 200° must not be applied.

As described above, the fundamental principle of the present invention lies in that the Al-Cu film and the Cu film are laminated, and the network structure is formed by $CuAl_2$ formed in the grain boundary of Al in the Al-Cu film with the Cu film being the center, so as to inhibit stress migration.

As described in the afore-mentioned Yuhara et al. reference, also, the fundamental principle of the present invention is based on the concept that the internal stress of the Al alloy film is largely associated with power characteristics (life) of the surface acoustic wave device, power characteristics are high when the stress of the Al alloy film is zero or rather compressive, and power characteristics drop with higher tensile stress.

Figure 14:
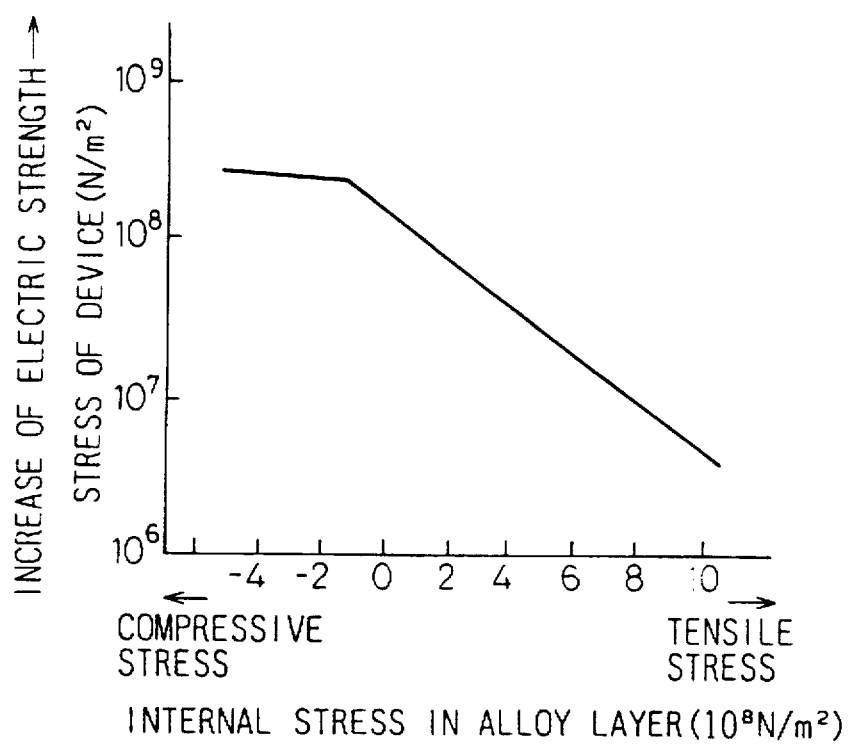
FIG. 14 is a graph showing the relationship between an internal stress of an alloy film and power characteristics of a surface acoustic wave device.

FIG. 14 is a graph showing the relation between the internal stress of the alloy film and power characteristics of the surface acoustic wave device. This graph cites the data reported previously by Yuhara et al. The axis of abscissa represents the internal stress of the alloy film, and the ordinate represents the stress of the surface acoustic wave device, that is, the tendency of power characteristics. As can be seen from this graph, power characteristics of the surface acoustic wave device are high when the internal stress of the alloy film is zero or compressive, but are deteriorated when the internal stress is tensile.

Accordingly, power characteristics can be improved by arranging the films so that their internal stresses have opposite signals when the multi-layered alloy film is formed, and moreover, the magnitudes of the internal stresses are mutually in equilibrium, in order to regulate the internal stress of the film as a whose to zero or somewhat compressive.

Next, several embodiments of the present invention will be explained with reference to the drawings. It is to be understood that these embodiments are merely illustrative and in no way limit the present invention.

Figure 1:
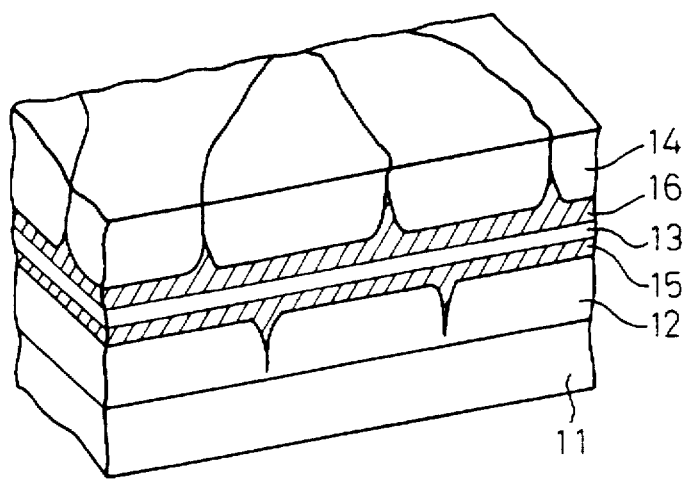
FIG. 1 is a perspective view useful for explaining the structure of a surface acoustic wave filter having a three-layered structure according to the prior art.
Figure 2:
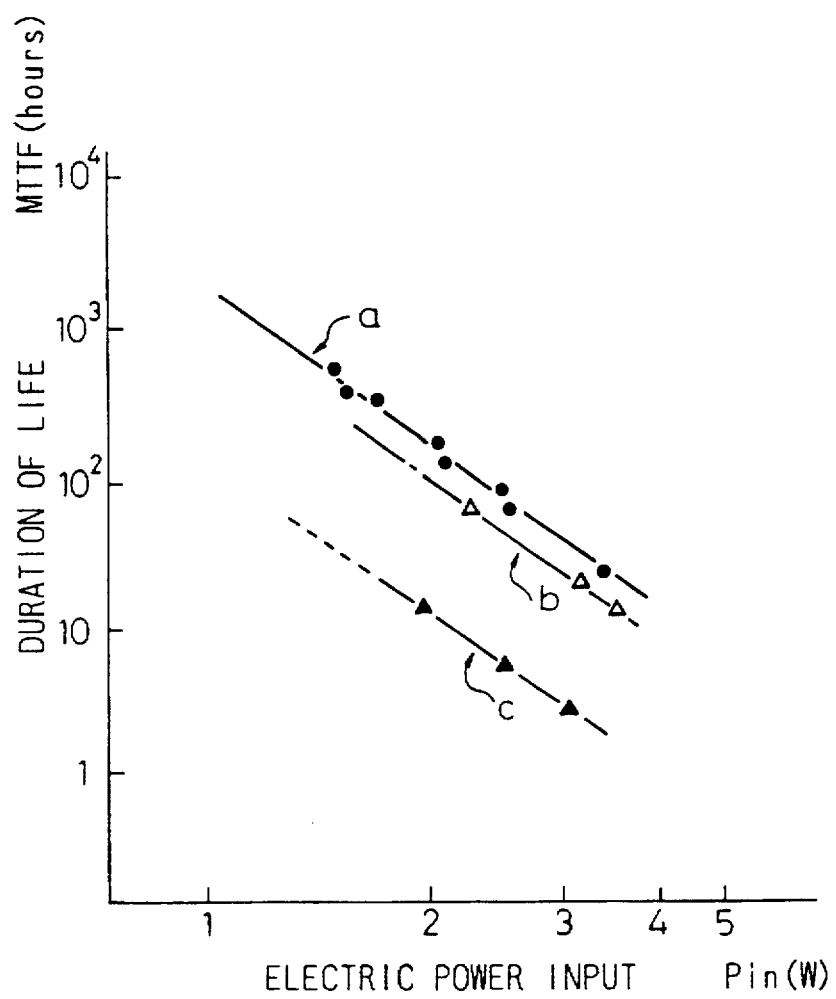
FIG. 2 is a graph useful for explaining power characteristics of a surface acoustic wave filter having a three-layered structure according to the prior art.
Figure 3:
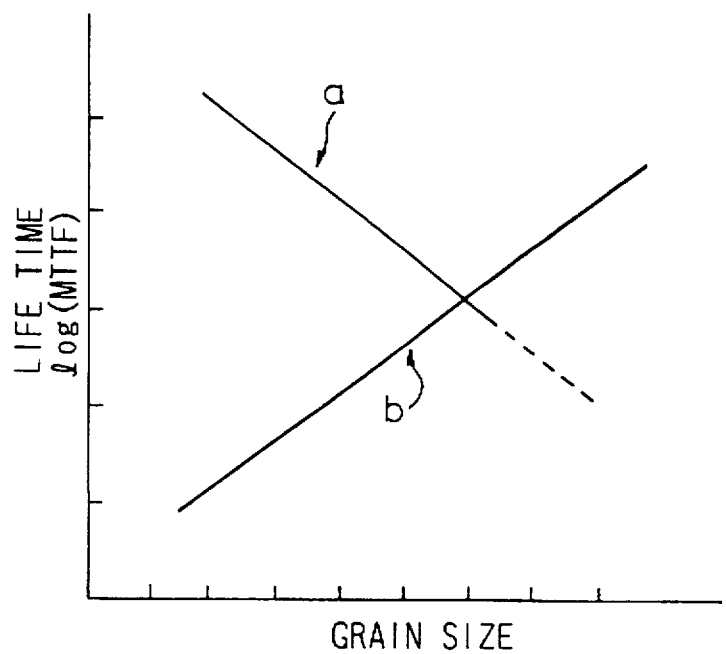
FIG. 3 is a graph useful for explaining the relationship between a grain size of an electrode material and life time.
Figure 4:
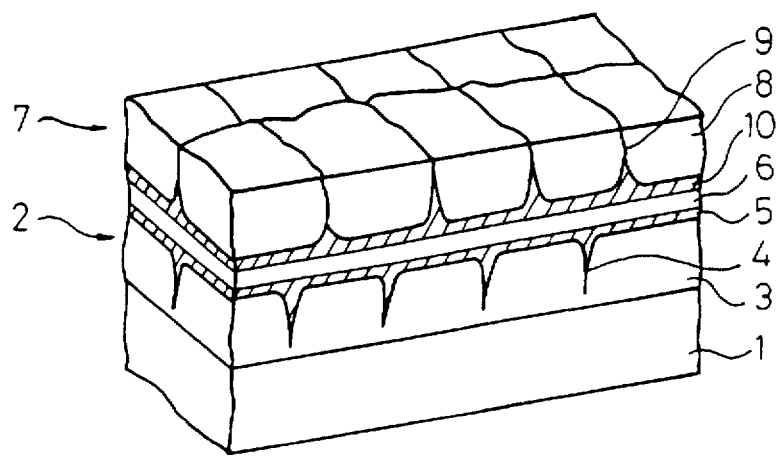
FIG. 4 is a perspective view useful for explaining the structure of a surface acoustic wave device according to one embodiment of the present invention.

FIG. 4 is an explanatory structural view of a surface acoustic wave device according to an embodiment of the present invention. In the drawing, reference numeral 1 denotes a $LiTaO_3$ substrate, 2 is an Al-1%Cu film, 3 is Al crystal grains, 4 is a grain boundary, 5 is $CuAl_2$, 6 is a Cu film, 7 is an Al-1%Cu film, 8 is Al crystal grains, 9 is a grain boundary, and 10 is $CuAl_2$. In the surface acoustic wave device of this embodiment, a 1,000Å -thick Al-1%Cu film 2 is formed on the $LiTaO_3$ substrate 1 having a piezoelectric property while the temperature is kept below 200° C., a 400Å -thick Cu film 6 is formed on the former, and a 1,000Å -thick Al-1%Cu film 7 is formed on the Cu film 6. In this way, a three-layered film having a total thickness of 2,400Å is formed. This three-layered laminate film is patterned to form an interdigital electrode (hereinafter referred to as the "three layered film electrode A").

In the embodiment shown in the drawing, $CuAl_2$ 5 is formed in the grain boundary 4 of the Al crystal grains 3 of the Al1%Cu film 2, $CUAl_2$ 10 is formed in the grain boundary 9 of the Al crystal grains 8 of the Al1%Cu film, and $CuAl_2$ 5, 10 is also formed between the Cu film 6 and the upper and lower Al1%Cu films 2, 7.

To compare with the three-layered electrode A of this embodiment, an interdigital electrode consisting of a 3,200Å -thick Al1%CU single-layered film (hereinafter referred to as the "single-layered film electrode C") is formed on the $LiTaO_3$ substrate.

To compare the effect of stress regulation of the three-layered film electrode, an interdigital electrode (hereinafter referred to as the "three-layered film electrode B") is formed by first forming a 700Å -thick Al-1%Cu film, a 600Å -thick Cu film and a 700Å -thick Al-1%Cu film on the $LiTaO_3$ substrate in the total thickness of 2,000Å and patterning this three-layered laminate film.

To examine the heat-treatment effect of the three-layered film electrode A, an interdigital electrode (hereinafter referred to the "three-layered film electrode A") is formed by heat-treating the three-layered film electrode A at 400° C. after the film formation.

The thickness of these electrode films is determined in the following way.

A. As a reference a 3,200Å -thick Al1%CU single layer film will be considered.

When a surface acoustic wave filter is produced using this Al1%Cu single layer film as the electrode by the later-appearing method, a transmission band-pass filter of an NTT specification having 933 MHz as the center frequency can be realized.

In the surface acoustic wave filter, the center frequency changes in accordance with the mass of the electrode due to the mass load effect. Therefore, in order to correctly compare power characteristics when the electrode is changed, it is necessary to bring the mass of the electrode film into conformity with the mass of the electrode of the surface acoustic wave filter using the Al1%Cu single layer film electrode C so as to prevent frequency fluctuation.

The density of Cu is 8.9, the density of 1 is 2.7, and the density of the Cu film is about three times the density of Al. Therefore, the masses of the three-layered film electrodes A, B and AA are substantially the same as the mass of the 3,200Å -thick Al1%Cu single layer film electrode as the reference. Accordingly, the surface acoustic wave filters using the three-layered film electrodes A, B and AA exhibit substantially the same characteristics as the 933 MHz filter.

B. The balance of the internal stresses of the multi-layered film electrode must be secured so as to improve power characteristics as already described.

If the substrate temperature and the film formation rate at the time of growth of the multi-layered film are constant, the internal stress of the multi-layered film depends on the film thickness of each layer.

Figure 5:
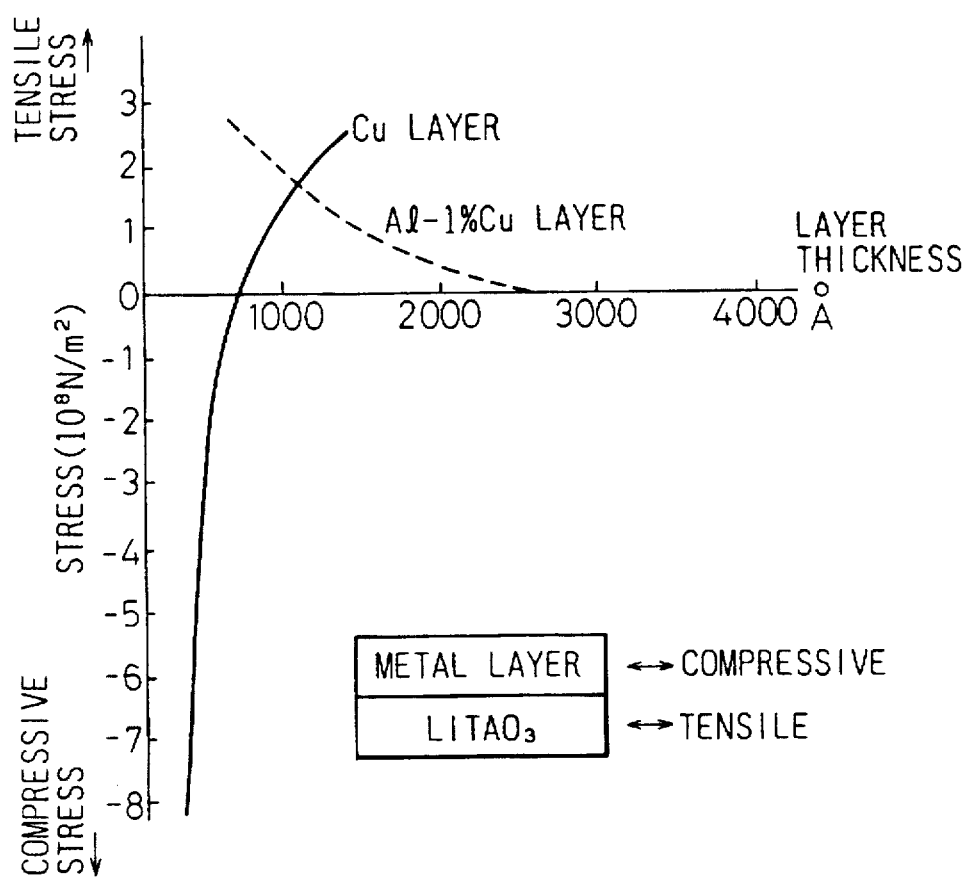
FIG. 5 is a graph useful for explaining experimental results of a film thickness and an internal stress of each of an Al-1%Cu film and a Cu film.

FIG. 5 is a graph useful for explaining the experimental results of the internal stresses of the Al-1%Cu film and the Cu film. In this graph, the abscissa represents the film thickness of the metal film, and the ordinate represents the stress. In the graph, the experimental results of the film thickness of the Al-1%Cu film and the Cu film, and the internal stress are plotted.

When the balance of the internal stress inside the laminate film is taken into consideration, the stress is $-6\times10^8$ N/m² (the – sign represents the compressive stress and the + sign represents the tensile stress) in the case of the Cu film at a thickness of 400Å , and $+2\times10^8$ N/M² in the case of the Al-1%Cu film at a film thickness of 1,000Å in the three-layered film electrode A consisting of the Al-1%Cu film/Cu film/Al-1%Cu film. Therefore, the stress is $-2\times10^8$ N/m² in the three-layered film electrode as a whole, and a weak compressive stress is applied. According to FIG. 14 previously explained, this internal stress $-2\times10^8$ N/M² is included in a region in which power characteristics of the multi-layered film electrode are not deteriorated.

In the case of the three-layered film electrode B, the stress value is $-1\times10^8$ N/m² for the Cu film at a thickness of 600Å, and $2\times2.5\times10^8$ N/M² for each Al-1%Cu film at a thickness of 700Å. The total stress is $4\times10^8$ N/M², and is the tensile stress. According to FIG. 14, this internal stress of $4\times108^8$ N/M² is included in the region where power characteristics of the multi-layered film electrode are deteriorated.

Figure 6:
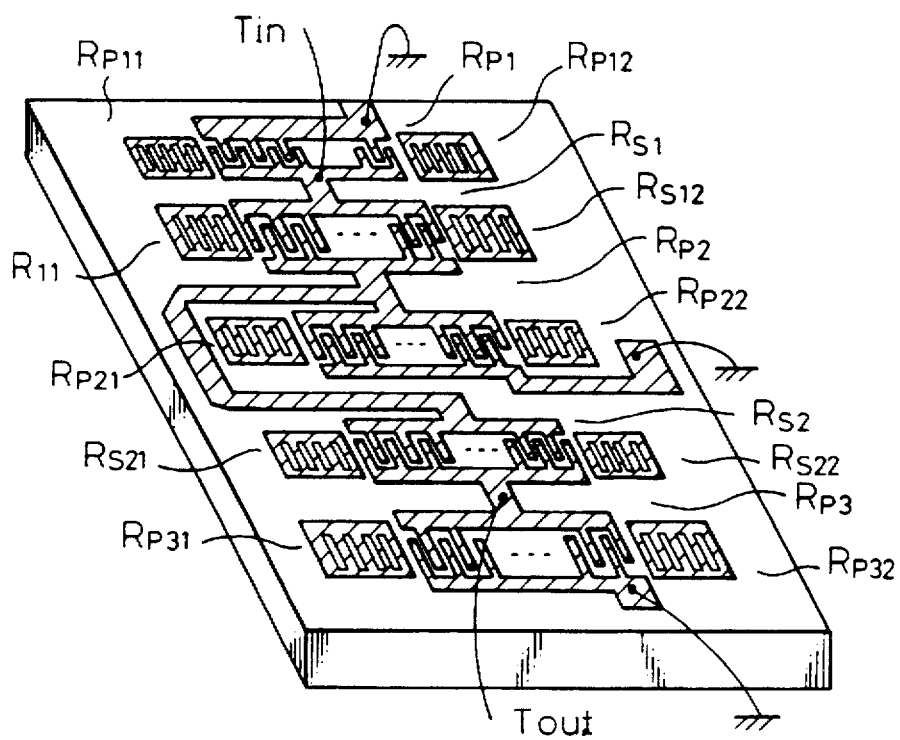
FIG. 6 is a perspective view useful for explaining the structure of a surface acoustic wave filter according to an embodiment of the present invention.
Figure 7:
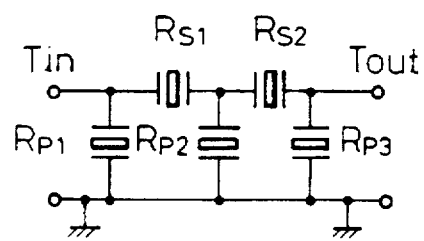
FIG. 7 is an equivalent circuit diagram of the surface acoustic wave filter shown in FIG. 6.

FIGS. 6 and 7 are explanatory structural views of the surface acoustic wave filter according to one embodiment of the present invention, wherein FIG. 6 is a perspective view and FIG. 7 is an equivalent circuit diagram. In the drawings, symbol $T_{in}$ denotes an input terminal, $T_{out}$ is an output terminal, $R_{p1}$ is a first parallel resonator, $R_{p2}$ is a second parallel resonator, $Rp_{p3}$ is a third parallel resonator, $R_{s1}$ is a first series resonator, $R_{s2}$ is a second series resonator, and $R_{p11}$, $RP_{p12}$, $R_{p21}$, $R_{p22}$, $R_{p31}$, $R_{s32}$, $R_{s11}$, $R_{s12}$, $R_{s21}$ and $R_{s22}$ are reflectors.

The surface acoustic wave filter according to this embodiment is described in detail in Japanese Unexamined Patent Publication (Kokai) No. 5-183380 to which reference is hereby made. The multi-layered film interdigital electrode of this embodiment is formed on a 36°Y-X $LiTaO_3$ piezoelectric substrate of 1.5×2×0.5 mm, and the first series resonator $R_{s1}$ and the second series resonator $R_{s2}$ are connected in series from the input terminal $T_{in}$ towards the output terminal $T_{out}$. The first, second and third parallel resonators $R_{p1}$, $R_{p2}$ and $R_{p3}$ are grounded from the junction between the input terminal and the first series resonator $R_{p1}$, from the junction between the first and second series resonators $R_{s1}$, $R_{s2}$ and from the junction between the second series resonator $R_{s2}$ and the output terminal.

The reflectors $R_{s11}$, $R_{s12}$ are provided to the first series resonator $R_{s1}$, and the reflectors $R_{s21}$, $R_{s22}$ are provided to the second series resonator $R_{s2}$. The reflectors $R_{p11}$, $R_{p12}$ are provided to the first parallel resonator $R_{p1}$, and the reflectors $R_{p21}$, $R_{p22}$ are provided to the second parallel resonator $R_{p2}$. Further, the reflectors $R_{p31}$, $R_{p32}$ are provided to the third parallel resonator $R_{p3}$.

The 0.5 mm-thick $LiTaO_3$ piezoelectric substrate is used in such a manner that its 1.5 mm side as the x-axis direction of the crystal axis exists in the transverse direction of the drawing and its 2 mm side exists in the longitudinal direction of the drawing, or in other words, in the propagating direction of the surface acoustic wave. The pitch $\lambda_p$ of the electrodes of the first parallel resonator $R_{p1}$, is set to 4.39µm, its aperture length is set to 160µm, the aperture length of the first series resonator $R_{s1}$ is set to 60µm, and the electrode pitch of the second series resonator $R_{s2}$ is set to 4.16µm.

Figure 8:
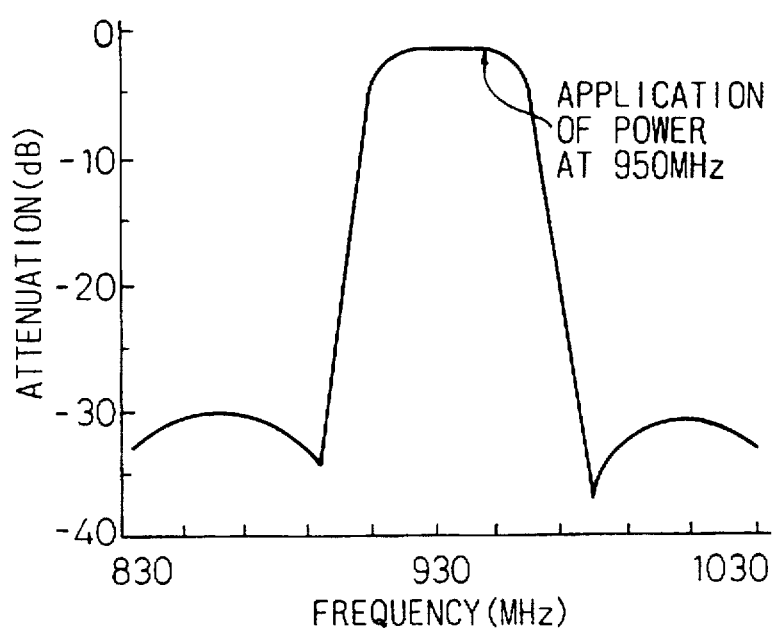
FIG. 8 is a graph showing transmission characteristics of the surface acoustic wave filter according to an embodiment of the present invention.

FIG. 8 is a graph showing the transmission characteristics of the surface acoustic wave filter according to one embodiment of the present invention. The abscissa in the graph represents frequency (MHz) and the ordinates represents attenuation (dB). As shown in the graph, the surface acoustic wave filter has the characteristics of a band-pass filter having an about 60 MHz pass band in the proximity of 930 MHz. Attenuation in the pass band is 1.5 dB.

The life test of this surface acoustic wave filter is carried out by selecting a frequency, at which power characteristics are the lowest among the pass band, that is, near 950 MHz in this embodiment, and applying a radio frequency power thereto. At this time, the temperature of the filter chip rises somewhat, but an external temperature is controlled in taking such a temperature rise into consideration in advance, and radio frequency power and its life are controlled while the surface temperature of the filter chip is kept constant.

Figure 9:
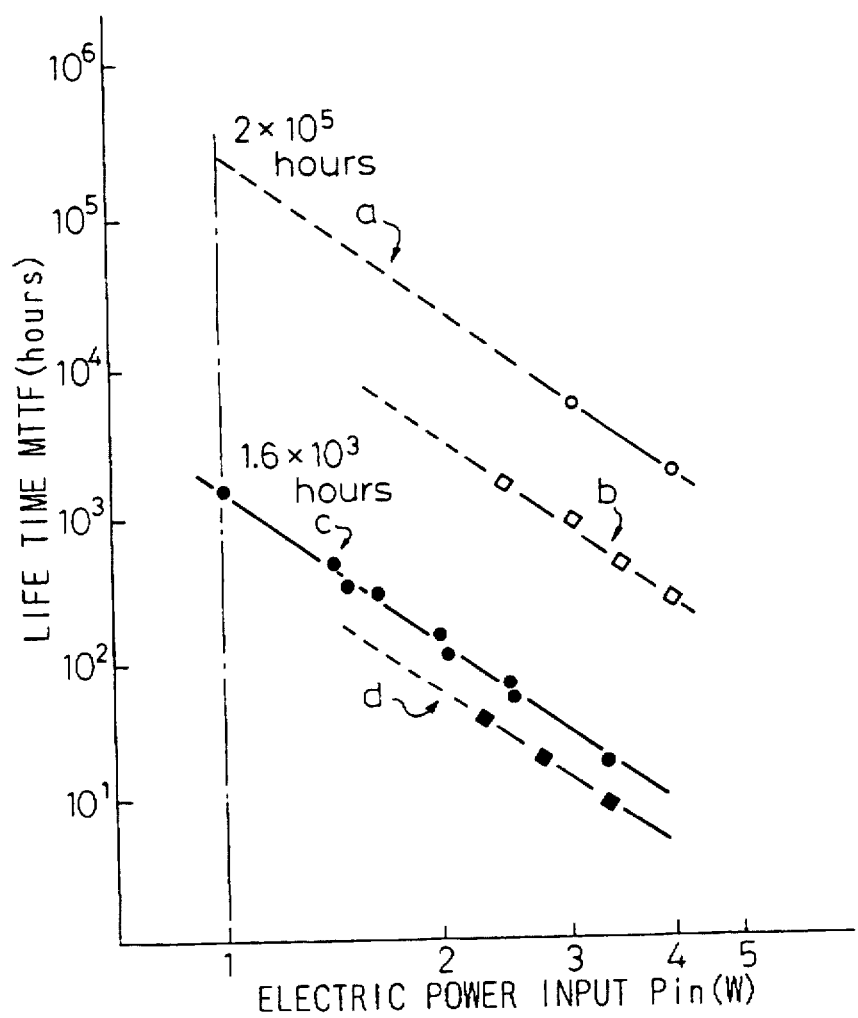
FIG. 9 is a graph showing power characteristics of the surface acoustic wave filter according to an embodiment of the present invention.

FIG. 9 is a graph showing the power characteristics of the surface acoustic wave filter according to one embodiment of the present invention. The abscissa in the graph represents input power (W) and the ordinate represents mean time to failure (MTTF). The failure is defined by the degradation of 0.3 dB for 1.5 dB insertion loss in the pass band (see, FIG. 8).

Generally, when the MTTF of the electrode of the surface acoustic wave filter relies on the Arrhenius' equation, that is, $$\ln(MTTF) = A + B/T - n \times \ln(Pin),$$

the natural logarithm of the input power (Pin) and the natural logarithm of mean time to failure (MTTF) are expressed by rightwardly descending straight lines. Here, A, B and n are proportional constants.

Besides the surface acoustic wave filter using the electrode of this embodiment, this FIG. 9 shows also the life time of the surface acoustic wave filters using the four kinds of the electrodes described above, respectively. In this measurement, the filter chip temperature T is set to 393 K (120° C.).

Curve a in FIG. 9 represents the life time of the surface acoustic wave filter using the Al1%Cu/Cu/l-1%Cu film (three-layered film electrode A) which is not heat-treated and has a compressive stress of $-2\times10^8$ N/m². Curve b represents the life time of the surface acoustic wave filter using the Al1%Cu/Cu/l-1%Cu film (three-layered film electrode B) which is not heat-treated and has a tensile stress of $+4\times10^8$ N/M². Curve c represents the life time of the surface acoustic wave filter using the Al1%Cu film (single layer film electrode C) which is not heat-treated, and curve d represents the life time of the surface acoustic wave filter using the Al1%Cu/Cu/Al-1%Cu film (three-layered electrode AA) which is heat-treated at 400° C. By the way, the substrate temperature when forming each film is 120° C.

In comparison with the surface acoustic wave filter (see curve c) using the conventional Al1%Cu single layer film (single layer film electrode C), the life time of the surface acoustic wave filter (see curve a) using the 1-1%Cu/Cu/Al-1%Cu film (three-layered film electrode A) of this embodiment, which is not heat-treated and has the compressive stress of $-2\times10^8$ N/M² is 120 times.

The life time of the acoustic wave filter (see curve d) having the three-layered film (three-layered film electrode AA) obtained by heat-treating the Al-1%Cu/Cu/Al-1%Cu film (three-layered electrode A) of this embodiment which is not heat-treated and has a compressive stress of $-2\times10^8$ N/M², becomes drastically short, and is shorter than the life time of the surface acoustic wave filter (see curve c) using the conventional Al-1%Cu single film layer (single layer film electrode).

Further, the life time of the Al1%Cu/Cu/Al-1%Cu film (three-layered film electrode B) which is not heat-treated and has a tensile stress of $+4\times10^8$ N/M² (see curve b) is improved in comparison with the life time of the surface acoustic wave filter (see curve c) using the conventional Al1%Cu single layer film (single layer film electrode C), but is incomparatively shorter than the life time of the surface acoustic wave filter of this embodiment having the internal stress thereof regulated (see curve a).

The surface acoustic wave filter of this embodiment can provide 200,000 hours as the useful life at the time of input of 1W. Accordingly, the filter can be said to have sufficient power characteristics as an antenna duplexer.

Though a general piezoelectric crystal substrate can be used as the piezoelectric substrate, the piezoelectric materials illustrated in this embodiment, such as $LiTaO_3$ (36° Y cut-X propagation), $LiNbO_3$ (64° Y cut-X propagation), etc., are effective in order to improve the characteristics of the filter, and the like.

As described above, the present invention employs the multi-layered structure of the Al-Cu film/Cu film/Al-Cu film as the electrode material. Therefore, even in the case of surface acoustic wave devices which cannot be heat-treated at a high temperature due to stress migration, the present invention can drastically improve their power characteristics, and greatly contributes to the improvement in performance of the surface acoustic wave devices such as the surface acoustic wave filters.

We claim:

1. A process for producing a surface acoustic wave device having a piezoelectric substrate and an electrode disposed on said substrate, comprising the steps of:

alternately laminating an aluminum copper alloy film and a copper film on said piezoelectric substrate at a temperature not higher than 200° C. to thereby form a laminate structure having at least three layers, with two aluminum-copper alloy films sandwiching one copper film;

patterning the resultant laminate structure to form an electrode; and carrying out subsequent processings while maintaining the temperature of not higher than 200° C.

2. A process for producing a surface acoustic wave device according to claim 1, wherein the laminate structure consists of two aluminum-copper alloy films sandwiching one copper film.

3. A process for producing a surface acoustic wave device according to claim 1, wherein the piezoelectric substrate is made of a piezoelectric material selected from the group consisting of $LiTaO_3$ and $LiNbO_3$.

4. A process for producing a surface acoustic wave device according to claim 1, wherein:

the aluminum-copper alloy films have one of a tensile internal stress and a compressive internal stress, the copper film has the other of a tensile internal stress and a compressive internal stress, such that the internal stresses of the aluminum copper alloy films and the cooper film have mutually opposite directions, and the sum of the internal stresses is either zero or compressive.

5. A process for producing a surface acoustic wave device according to claim 1, wherein the aluminum-copper alloy films are polycrystalline films having aluminum crystal grains and $CuAl_2$ segregated at a grain boundary thereof.

6. A process for producing a surface acoustic wave device according to claim 1, wherein the aluminum-copper alloy films are formed by sputtering or electron beam deposition.

* * * * *

UNITED STATES PATENT AND TRADEMARK OFFICE
CERTIFICATE OF CORRECTION

PATENT NO. : 5,774,962

DATED : July 7, 1998

INVENTOR(S) : Yoshio SATOH et al.

Page 1 of 2

It is certified that error appears in the above-indentified patent and that said Letters Patent is hereby corrected as shown below:

Col. 1, line 18, change "$10_{-5}$" to --$10^{-5}$--;
line 28, change "$10_{-5}$" to --$10^{-5}$--.

Col. 3, line 67, change "three-Alayered" to --three-layered--.

Col. 4, line 12, change "Alayered" to --layered--.

Col. 5, line 52, change "300Åto" to --300Å to--;
line 65, change "500Åto" to --500Å to--;
line 67, change "300Åto" to --300Å to--.

Col. 8, line 21, change "$CUI_2$" to --$CuA\ell_2$--.

Col. 10, line 6, change "1" to --$A\ell$--;
line 30, change "the+sign" to --the + sign--;
line 32, change "$M^2$" to --$m^2$--;
line 38, change "$M^2$" to --$m^2$--;
line 43, change "$M^2$" to --$m^2$--;
line 44, change "$M^2$" to --$m^2$--;
line 46, change "$M^2$" to --$m^2$--;
line 45, change "$4 \times 108^8$" to --$4 \times 10^8$--;
line 54, change "$Rp_{p3}$" to --$R_{p3}$--;
line 56, change "$Rp_{p12}$" to --$R_{p12}$--.

UNITED STATES PATENT AND TRADEMARK OFFICE
CERTIFICATE OF CORRECTION

PATENT NO.  : 5,774,962
DATED       : July 7, 1998
INVENTOR(S) : Yoshio SATOH et al.

It is certified that error appears in the above-indentified patent and that said Letters Patent is hereby corrected as shown below:

Col. 11,  line 10, change "$R_{p3}$" to --$R_{p31}$--;
          line 67, change "$M^2$" to --$m^2$--.

Col. 12,  line 13, change "$M^2$" to --$m^2$--;
          line 19, change "$M^2$" to --$m^2$--;
          line 25, change "$M^2$" to --$m^2$--.

Signed and Sealed this

Eighth Day of December, 1998

Attest:

BRUCE LEHMAN

Attesting Officer       Commissioner of Patents and Trademarks